US009067791B2

(12) United States Patent
Kim et al.

(10) Patent No.: US 9,067,791 B2
(45) Date of Patent: Jun. 30, 2015

(54) EMBEDDED ARRAYS OF VERTICALLY ALIGNED CARBON NANOTUBE CARPETS AND METHODS FOR MAKING THEM

(75) Inventors: Myung Jong Kim, Houston, TX (US); Nolan Walker Nicholas, South Charleston, WV (US); W. Carter Kittrell, Houston, TX (US); Howard K. Schmidt, Cypress, TX (US)

(73) Assignee: WILLIAM MARSH RICE UNIVERSITY, Houston, TX (US)

( * ) Notice: Subject to any disclaimer, the term of this patent is extended or adjusted under 35 U.S.C. 154(b) by 1176 days.

(21) Appl. No.: 12/297,115

(22) PCT Filed: Apr. 23, 2007

(86) PCT No.: PCT/US2007/067198
§ 371 (c)(1),
(2), (4) Date: Oct. 14, 2009

(87) PCT Pub. No.: WO2007/124477
PCT Pub. Date: Nov. 1, 2007

(65) Prior Publication Data
US 2012/0107597 A1     May 3, 2012

Related U.S. Application Data

(60) Provisional application No. 60/793,911, filed on Apr. 21, 2006.

(51) Int. Cl.
*B32B 5/16*     (2006.01)
*B29C 45/14*    (2006.01)
(Continued)

(52) U.S. Cl.
CPC ............. *C01B 31/0206* (2013.01); *B82Y 10/00* (2013.01); *B82Y 30/00* (2013.01); *B82Y 40/00* (2013.01); *H01L 51/0048* (2013.01)

(58) Field of Classification Search
CPC ............ B32B 5/16; B29C 45/14; H01B 1/04; H01L 51/0048; C01B 31/0206
USPC ............... 252/503, 506, 514, 520.3; 977/750, 977/753, 777, 789, 810
See application file for complete search history.

(56) References Cited

U.S. PATENT DOCUMENTS 6,440,761 B1 * 8/2002 Choi ............................ 438/20
7,071,406 B2   7/2006 Smalley et al.
(Continued)

FOREIGN PATENT DOCUMENTS

JP    2003 286017     10/2003
WO    WO 00/73204     12/2000
(Continued)

OTHER PUBLICATIONS

Kim, et al., "Efficient Transfer of a VA-SWNT Film by a Flip-Over Technique", J. Am. Chem. Soc., 128 (2006), pp. 9312-9313.
(Continued)

*Primary Examiner* — Jennifer Chriss
*Assistant Examiner* — Camie Thompson
(74) *Attorney, Agent, or Firm* — Winstead PC

(57) ABSTRACT

According to some embodiments, the present invention provides a system and method for supporting a carbon nanotube array that involve an entangled carbon nanotube mat integral with the array, where the mat is embedded in an embedding material. The embedding material may be depositable on a carbon nanotube. A depositable material may be metallic or nonmetallic. The embedding material may be an adhesive material. The adhesive material may optionally be mixed with a metal powder. The embedding material may be supported by a substrate or self-supportive. The embedding material may be conductive or nonconductive. The system and method provide superior mechanical and, when applicable, electrical, contact between the carbon nanotubes in the array and the embedding material. The optional use of a conductive material for the embedding material provides a mechanism useful for integration of carbon nanotube arrays into electronic devices.

18 Claims, 2 Drawing Sheets

(51) Int. Cl.
*H01B 1/04* (2006.01)
*B82Y 30/00* (2011.01)
*C01B 31/02* (2006.01)
*B82Y 10/00* (2011.01)
*B82Y 40/00* (2011.01)
*H01L 51/00* (2006.01)

(56) References Cited

U.S. PATENT DOCUMENTS

| | | | |
|---|---|---|---|
| 7,105,428 B2 | 9/2006 | Pan et al. | |
| 2004/0150312 A1* | 8/2004 | McElrath et al. | 313/310 |
| 2005/0230270 A1* | 10/2005 | Ren et al. | 205/777.5 |
| 2006/0035087 A1* | 2/2006 | Yadav et al. | 428/411.1 |
| 2008/0095694 A1* | 4/2008 | Nakayama et al. | 423/445 B |

FOREIGN PATENT DOCUMENTS

| | | | |
|---|---|---|---|
| WO | WO2005-102924 | * | 3/2005 |
| WO | WO 2007/055744 | | 5/2007 |

OTHER PUBLICATIONS

Hata, et al., "Water-Assisted Highly Efficient Synthesis of Impurity-Free Single-Walled Carbon Nanotubes", Science 306 (2004), pp. 1362-1364.

Murakami, et al., "Growth of vertically aligned single-walled carbon nanotube films on quartz substrates and their optical . . . ", Chem. Phys. Lett., 385 (2004), pp. 298-303.

Eres, et al., "Molecular Beam-Controlled Nucleation and Growth of Vertically Aligned Single-Wall Carbon Nanotube Arrays", J. Phys. Chem. B, 109 (2005), pp. 16684-16694.

Zhang, et al., "Ultra-high-yield growth of vertical single-walled carbon nanotubes: Hidden roles of hydrogen and oxygen", Proc. Nat. Acad. Sci., 102 (2005), pp. 16141-16145.

Iwasaki, et al., "Direct Evidence for Root Growth of Vertically Aligned Single-Walled Carbon Nanotubes by Microwave . . . ", J. Phys. Chem. B, 109 (2005), pp. 19556-19559.

Murakami, et al., "Detachment of vertically aligned single-walled carbon nanotube films from substrates and their re-attachment . . . ", Chem. Phys. Lett., 422 (2006), pp. 575-580.

Zhu, et al., "Well-Aligned Open-Ended Carbon Nanotube Architectures: An Approach for Device Assembly", Nano. Lett., 6 (2006), pp. 243-247.

Lahiff, et al., "Physical Properties of novel free-standing polymer-nanotube thin films", Carbon, 44 (2006), pp. 1525-1529.

Liu, et al., "Enhancement of field emission properties of cyanoacrylate-carbon nanotube arrays by laser treatment", Nanotechnology, 15 (2004), pp. 1033-1037.

Li, et al., "Multicomponent micropatterns or carbon nanotubes", Synthetic Metals, 154 (2005), pp. 225-228.

Alexandrou, et al., "Polymer-nanotube composites: Burying nanotubes improves their field emission properties", App. Phys. Left, 80 (2002), pp. 1435-1437.

Lee, at al., "Carrier transport and electron field-emission properties of a nonaligned carbon nanotube thick film mixed with . . . ", J. App. Phys., 88 (2000), pp. 4181-4185.

Poa, et al., "Field emission from nonaligned carbon nanotubes embedded in a polystyrene matrix", App. Phys. Lett., 80 (2002), pp. 3189-3191.

International Search Report and Written Opinion for PCT/US2007/067198, mailed Feb. 27, 2008.

* cited by examiner

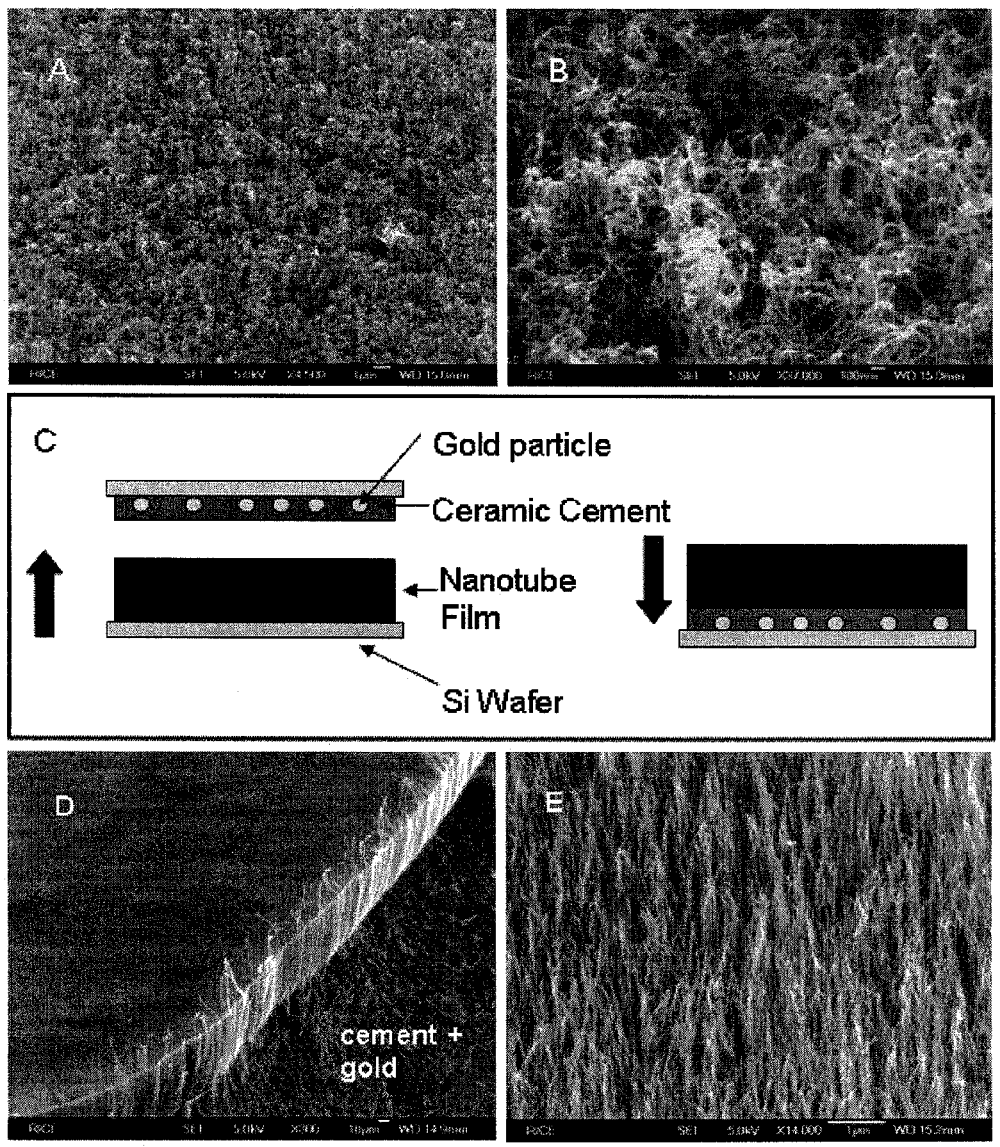
FIGURES 1A, 1B, 1C, 1D, and 1E

EMBEDDED ARRAYS OF VERTICALLY ALIGNED CARBON NANOTUBE CARPETS AND METHODS FOR MAKING THEM

CROSS-REFERENCE TO RELATED APPLICATION

This application claims priority to and benefit of U.S. Provisional Application Ser. No. 60/793,911, filed on Apr. 21, 2006, entitled: EMBEDDED ARRAYS OF VERTICALLY ALIGNED CARBON NANOTUBE CARPETS AND METHODS FOR MAKING THEM, by inventors Myong Jong Kim.

STATEMENT OF GOVERNMENT SPONSORSHIP

This invention was made with government support under Grant Number DE-AC05-00OR22725 awarded by the Department of Energy. The Government has certain rights in the invention.

FIELD OF THE INVENTION

The present invention relates in general to supported arrays of carbon nanotubes, more particularly to a system and method for supporting a carbon nanotube array involving embedding an entangled carbon nanotube mat integral with the array in an embedding material.

BACKGROUND OF THE INVENTION

Carbon nanotubes are the focus of intensive study for a variety of applications in mechanical and/or electronic devices. Carbon nanotubes can be visualized as cylinders of rolled up graphene sheets, which may be capped so as to close the tubes. They tend to have a high aspect ratio, in particular with a large length compared to the diameter. Carbon nanotubes may have various electrical properties, depending on parameters of their structure. In particular carbon nanotubes may be conductive. Thus, there has been interest in incorporating them into nanoelectronic devices. In such devices, it may be useful to have the nanotubes arranged in a regular array of vertically aligned nanotubes. There has been interest in growing the nanotubes in place on a substrate. However, the variety of substrates suitable for growth is low. Further, the substrates tend not to be conductive.

Thus, there remains a need for providing a system and method for supporting a carbon nanotube array that provides improved selection of the supporting material and/or substrate.

BRIEF DESCRIPTION OF THE INVENTION

These and other features and advantages of the invention will be apparent to those skilled in the art from the following detailed description of various embodiments, taken together with the accompanying figures and claims, in which:

According to some embodiments, the present invention provides a system and method for supporting a carbon nanotube array that involve an entangled carbon nanotube mat integral with the array, where the mat is embedded in an embedding material. The embedding material may be depositable on a carbon nanotube. A depositable material may be metallic or nonmetallic. The embedding material may be an adhesive material. The adhesive material may optionally be mixed with a metal powder. The embedding material may be supported by a substrate or self-supportive. The embedding material may be conductive or nonconductive. The system and method provide superior mechanical and, when applicable, electrical, contact between the carbon nanotubes in the array and the embedding material. The optional use of a conductive material for the embedding material provides a mechanism useful for integration of carbon nanotube arrays into electronic devices.

BRIEF DESCRIPTION OF THE DRAWINGS

The foregoing summary as well as the following detailed description of the preferred embodiment of the invention will be better understood when read in conjunction with the appended drawings. It should be understood, however, that the invention is not limited to the precise arrangements and instrumentalities shown herein. The components in the drawings are not necessarily to scale, emphasis instead being placed upon clearly illustrating the principles of the present invention. Moreover, in the drawings, like reference numerals designate corresponding parts throughout the several views.

The invention may take physical form in certain parts and arrangement of parts. For a more complete understanding of the present invention, and the advantages thereof, reference is now made to the following descriptions taken in conjunction with the accompanying drawings, in which:

FIG. 1A shows a low magnification SEM image taken from the top of an exemplary carbon nanotube carpet showing a mat of entangled bundles of carbon nanotubes;

FIG. 1B shows a high magnification SEM image taken from the top of the top of the same exemplary carbon nanotube carpet shown in FIG. 1A, further showing the same mat of entangled bundles of carbon nanotubes;

FIG. 1C shows a schematic drawing of an exemplary flip-over technique using cement with gold particles as an embedding material to embed the entangled mat shown in FIG. 1A;

FIG. 1D shows a low magnification SEM images taken from an exemplary bottom exposed flat surface created using the technique shown in FIG. 1C, showing a clean and well aligned array of carbon nanotube bundles;

FIG. 1E shows a high magnification SEM images taken from the same exemplary bottom exposed flat surface shown in FIG. 1D, further showing the clean and well aligned array of carbon nanotube bundles;

DETAILED DESCRIPTION OF THE INVENTION

Figures 2A, 2B:
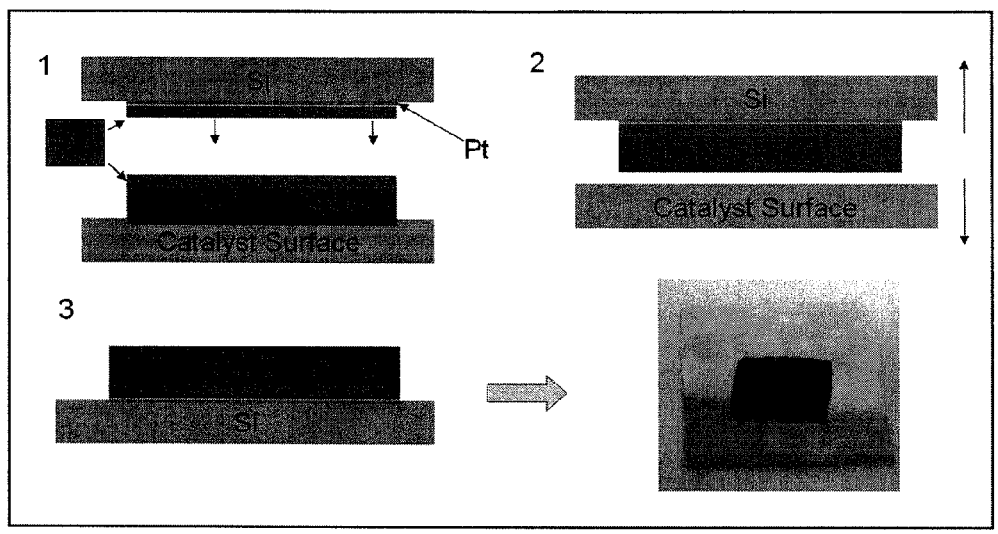
FIG. 2A shows a schematic drawing of an exemplary flip-over technique with deposited gold as an embedding material to embed an entangled mat such as shown in FIG. 1A.
FIG. 2B is a picture according to an exemplary embodiment, showing that a whole grown carpet has been transferred using the technique illustrated in FIG. 2A to a conductive surface.

According to some embodiments, the present invention provides a system and method for supporting a carbon nanotube array that involve an entangled carbon nanotube mat integral with the array, where the mat is embedded in an embedding material.

It is considered that an embedded layer of a so-called "entangled mat" into an embedding material forms a new composition of matter. This structure confers superior mechanical and electrical properties to other previous compositions of matter.

It believed by the present inventors that the present system and method creates a larger conductive junction between a substrate with a conductive surface and a carbon nanotube film than previous methods. Further it is believed by the present inventors that the present system and method creates a better mechanical connection than previous methods or as grown films and mechanically stabilizes the structure of the film itself.

The entangled mat may be partially embedding in the embedding material. Alternatively, the entangle mat may be completely embedded in the embedding material. It may be desirable for application in an electronic device to completely embed the entangled mat.

The embedding material may be disposed as a layer. The layer may be coated as thickly as desired. The lower limit may be determined by the properties of the embedding material, such as the melting point and type of bonding and/or adhesion of the embedding material to the carbon nanotubes. According to some embodiments, the layer may be between about 10 nm and about 100 nm. The layer may be disposed on a substrate. The substrate may be any suitable substrate. Exemplary substrates include paper, plastic, glass, stainless steel, silicon, copper (Cu), and the like. It is desirable that the substrate is structurally sound and can withstand with processing. According to some embodiments, the substrate is stiff. Alternatively, according to some embodiments, the substrate is flexible. With a flexible (transfer) substrate, a method for removing the carbon nanotube array from a growth substrate may include pressing, then pealing. Pealing allow a shear to be concentrated where the pulling is occurring. Further, use of a flexible substrate may aid provision of a light, inexpensive, and floppy field effect transistor incorporating the carbon nanotube array.

It is contemplated that a layer of embedding material may be separated from the substrate after embedding the entangled mat in the layer.

It will be understood the embedding material has the property of bonding and/or adhering to a carbon nanotube. Thus, the embedding material may be bondable and/or adherable. Further, the embedding material may be depositable. According to some embodiments, a depositable material is also bondable. For example, metallic materials such as elemental metals, metal alloys, and the like are bondable. According to some embodiments, the embedding material may is self-bonding.

Carbon Nanotube Carpet Having an Entangled Mat Integral with an Array

The top surface of an as-grown VA-SWNT film is covered by entangled bundles creating a morphology (called a "carpet") which is not conducive to use as a substrate for continued growth or field emission applications. The VA-SWNT carpet normally grows only on particular substrates which are generally not useful for electrical device applications.

Using a flip-over technique to transfer a VA-SWNT carpet to a new substrate allows these limitations of the as-grown film to be overcome. This technique naturally forms mechanical contact between the entangled portion of the film and the substrate thereby conferring superior electrical and mechanical contact properties to the carpet/substrate system and exposing well aligned vertical bundles which are anticipated to be generally the most useful portion of the carpet for a wide variety of applications.

Flip-over transfer of Vertically Aligned Single Walled Carbon Nanotube (VA-SWNT) films allows for the transfer of VA-SWNT films, as grown, to substrates other than those which they were grown upon. The variety of substrates suitable for the growth of VA-SWNT film is relatively low. Therefore the ability to transfer them to new surfaces greatly increases the usefulness of these VA-SWNT films. For instance it is believed that the process of debonding from the growth substrate can leave open-ended tubes and/or needle-like morphologies of aligned nanotubes at the revealed surface when properly executed, thus providing a substrate well-suited to continued growth from this surface; also, the transfer of as-grown films to conductive substrates will allow the integration VA-SWNT film into electronic devices for purposes such as field emission devices, super capacitors, fuel cells and transistors.

It will be understood that although carpets comprised of vertically aligned single walled carbon nanotube materials are primarily mentioned herein, this material and technique is general in including carpets comprised of single and/or multiwalled carbon nanotubes. The single walled nanotubes are specifically mentioned, as they generally have higher performance characteristics for many applications and grow in entangled carpet morphologies whereas many vertically aligned structures of pure, large diameter multiwalled nanotubes grow in free-standing arrays.

While not intending to be bound by theory, it is believed that the carpet benefits from the existence of the entangled mat layer at the top of the as grown carpet.

According to some embodiments, the entangled mat is between about 10 and about 100 nm thick. According to some embodiments, the array is about 1 micron and about 2 mm. For example, the array may be between about 1 micron and about 100 microns.

According to some embodiments, one or more carbon nanotubes in a vertically aligned array varies locally in inclination from about 0 degrees to about 30 degrees. According to some embodiments, one or more carbon nantubes in a vertically aligned array varies from top with respect to bottom in inclination from between about 0 degrees and about 10 degrees.

According to some embodiments, the carbon nanotubes grow in bundles producing carpets containing carbon nanotubes arranged in bundles. The bundles are associated arrangements of individual carbon nanotubes. The individual nanotubes in a bundle may interact with each other. The cross-section of a bundle may have more of a glass-like arrangement of carbon nanotubes than a lattice-like arrangement. The bundle may have on average a particular spacing between the carbon nanotubes. According to some embodiments, the bundles entangle to form an entangled carbon nanotube mat.

According to some embodiments, the carbon nantoubes are unfunctionalized. Alternatively, according to some embodiments, the carbon nanotubes are functionalized. Carbon nanotubes may be functionalized after growth by conventional methods known in the art. It will be understood that the nature of the functionalization may be selected according to an intended application according to convention methods known in the art. For application in some electronic devices, it may be desirable for the nanotubes to be functionalized. Applications may involve the carbon nanotubes functioning electrochemically. For example, functionalized nanotubes may be more efficient because it is possible to apply a bias.

Embedded Entangled Mat Using Adhesive Embedding Material

According to some embodiments, the transfer of the carpet uses adhesion of embedding material to the carpet. Thus, transfer may proceed as follows An adhesive comprising ceramic cement or epoxy, polymer, elastomer, sintering colloid is prepared for bonding purposes on a suitable substrate (e.g. a silicon wafer). The SWNT film on the growth substrate is contacted to the adhesive and the adhesive/film structure is cured/set in this configuration. The less volumetric and geometric change the adhesive undergoes during curing the less disruption of initial VA-SWNT geometry will occur. The VA-SWNT film substrate and the adhesive are mechanically separated (pulled/pried apart), leaving the VA-SWNT film transferred bodily intact from the growth substrate to the adhesive substrate.

In an alternate embodiment the metal powder (e.g. gold powder, 0.8-1.5 micron size—Alfa Aesar) adhesive can be mixed with the adhesive to confer conductivity through the base of this structure.

In an alternate embodiment the adhesive layer can be chosen and applied in a geometry (such as a thicker film) which will have sufficient mechanical strength so that it does not require a substrate after it has set up.

Embedded Entangled Mat Using Depositable Embedding Material

According to some embodiments, the transfer of the carpet uses deposition of embedding material to the carpet. By way of example and not limitation, the depositable material may be gold. Thus, transfer may proceed as follows. A thin (e.g. 70 nm) gold layer is deposited on the top of the grown VA-SWNT carpet and on top of another suitably prepared substrate (e.g. Si covered by a Pt film) by sputtering. These two gold films are the contacted. This structure is then heated to sinter/melt/weld the two contacted gold films together. This growth substrate and transfer substrate are then separated (pried apart) to leave the VA-SWNT geometrically intact as grown upon the transfer substrate.

Suitably prepared substrates can be made using a variety of materials coated in a layer of metal which will bond to the layer coating the VA-SWNT carpet. Plastic and paper surfaces have been demonstrated, in this case avoiding heating of the structure (which could damage such substrates) can be avoided by localized mechanical debonding and peeling the affixed film off so that the detachment of the VA-SWNT carpet propagates at the interface being peeled.

In an alternative embodiment a variety of metals (including but not limited to Au, Ag, Pt, Pd, Ti, Al, Fe, W, Ta, Nb, Zn, Co, Ni, Cu and Cd) or metallic alloys or nonmetallic materials (including but not limited to metal oxide, intermetallic compounds and hydrocarbon materials) can be substituted for gold in deposition on the carpet and/or on the matching transfer substrate. These metals must be chosen so that these films exhibit a tendency to bond upon heating or alternative bonding treatment. Such alternative metals can be beneficial for purposes of decreased contact resistance, increased mechanical strength, increased heat resilience, etc. For example, the present inventors believe that Pd makes better contact to carbon nanotubes than gold.

In an alternative embodiment a layered structure of metallic films may be used for the purposes of transferring the carpet to the substrate, this may be useful for a variety of reasons such as mechanical and thermal stability of the films, electrical and magnetic properties of the layer coupling to the carpet etc. For example, Pt could be deposited upon the carpet, Au deposited upon that and this contacted to the a substrate of Au on Pt, in this case the Au deposited layers will tend to bond together under heat etc., while the Pt will be mechanically more stable under these treatments, bonding the film together without disrupting the layer bonding directly to the carpet. Alternatively, for example, Ti may be deposited on a carpet and/or a substrate and gold deposited upon that. Ti forms a carbide bond with carbon, e.g. in carbon nanotubes, and this influences the conduction properties through the layered structure.

In an alternative embodiment the metal film can be deposited onto the carpet by methods such as thermal evaporation, or chemical methods (used in the diffusion limited regime to create a surface film rather than infiltrate the carpet) such as CVD or electrochemical deposition, wet electro less metal deposition etc.

In an alternative embodiment a premade transfer substrate is not required; a transfer substrate can be fabricated by deposition of metal onto the carpet or by deposition onto metal already deposited onto the carpet (e.g. by methods such as sputtering, thermal evaporation, CVD, electrochemical deposition, etc).

In an alternative embodiment a step can be included to more efficiently debond the carpet from the growth substrate. Applied mechanical forces which tend to apply shearing forces between the carpet and the substrate will tend to preferentially debond the carpet from the growth substrate rather than from the transfer substrate. Pressure between the two substrates will tend to cause bending in the carpets which will apply shearing forces, application of force in a shearing configuration between the two substrates will also create forces of the necessary geometry. Other steps which will aid in the debonding of the film from the growth substrate are chemical attacks on the catalyst such as by gaseous HCl, or other liquid or gaseous acids or by chemical attack on the substrate (e.g. by NaOH).

In an alternative embodiment, a mechanical pressure and/or shearing force applied between the growth substrate and transfer substrate through the VA-SWNT film can be used to create a wavy morphology of the nanotubes in the film and/or "cracked" or "crevice" like morphologies in the film surface which persist after the removal of the applied force. Such morphologies will change the physical properties of the VA-SWNT films.

In an alternative embodiment suitable metals (e.g. platinum) can be deposited in a very thin layer (e.g. 5-10 nm) on the top of a VA-SWNT carpet. This structure is then subjected to a treatment to create defects (e.g. ion bombardment) in low density in the carbon nanotubes at the surface (near/through the Pt film). This will tend to cause the Pt to aggregate and covalently bond to these defect sites. This will allow better ohmic contact to be made between the carpet and the substrate; this also allows for better (covalent) mechanical contact to be made between the transfer substrate and the carpet.

In an alternate embodiment a bonding film (e.g. Au) may be deposited onto the carpet in a thin layer; a second much lower melting point metal can be deposited onto this layer or the transfer substrate for the purpose of forming a soldering join. Such soldering layers can be used for the purposes of filling in non-uniformities of carpet height. Such embodiments are anticipated to be useful for the creation of optically flat surfaces of the transferred carpet from non-flat grown carpets.

In an alternate embodiment other methods than furnace sintering/joining can be used to bond the metal layer deposited on the carpet and surface layer existing on the substrate together. These may include methods such as chemical reactions (a metal layer on the tube and an reactive species on the surface may react to form a joining layer) or by ohmic heating of the contact points of the layers (high frequency current propagated through this junction has proven effective in this method even though the growth substrate is insulating to DC current).

In an alternate embodiment the transfer substrate can have the surface bonding layer deposited in a patterned way. For example, if gold is deposited on the surface of the carpet and selectively on the surface of the transfer substrate then the carpet can be transferred to only those places where the gold resides on the transfer substrate.

In an alternate embodiment the transfer substrate may be prepared in such a way as to cause the bonding film upon further treatment to tend to gather itself into specific shapes on the transfer substrate. This may be accomplished by methods such as depositing patterned Pt (e.g. so that there is Pt in some places and not others) then upon heating of the film gold will tend to collect onto the platinum pattern and draw the nanotubes along with it creating a high local density pattern.

CONCLUSIONS

According to some embodiments, the present invention provides a transfer of a VA-SWNT film to a conductive surface without wet chemical methods which can damage the film materials or distort or deform the well aligned and uniform structure of SWNTs in a carpet morphology The well aligned bundles of exposed bottom with uniform density has been achieved for the first time.

Further, according to some embodiments, the present invention provides direct transfer from the as grown film to a new substrate and selective transfer of portions of the film in well defined regions.

Still further, according to some embodiments, the high contact area created by the present film transfer method between the substrate and the film is useful for mechanical and electronic applications and represents an improvement over previous methods The method described herein is useful for preparing open ended carbon nanotube substrate for continued growth applications (Armchair wire, chirality selected material, long carbon nanotube for mechanical applications), thermo-electric devices, heat dissipation, field emission filaments, super capacitor electrode, fuel cell electrode, transistors, solar cells, and other electronic applications.

The following examples are included to demonstrate particular embodiments of the present invention. It should be appreciated by those of skill in the art that the methods disclosed in the examples that follow merely represent exemplary embodiments of the present invention. However, those of skill in the art should, in light of the present disclosure, appreciate that many changes can be made in the specific embodiments described and still obtain a like or similar result without departing from the spirit and scope of the present invention.

Portions of the following examples include material published in Kim et al., "Efficient Transfer of a VA-SWNT Film by a Flip-Over Technique", J. Am. Chem. Soc. 128, p. 9313 (2006), a prepublication draft of which was included with the priority application U.S. Provisional Application Ser. No. 60/793,911, filed on Apr. 21, 2006, as an attachment thereto.

EXAMPLES

Example 1

This example illustrates providing an entangled carbon nanotube mat integral with a carbon nanotube array by using carbon nanotube carpet growth. This method was used to prepared the carpets, and thus the entangled mats, used in Examples 2 and 3.

VA-SWNT films were grown according to Hata et al.'s report (Hata, K.; Futaba, D. N.; Mizuno, K.; Namai, T.; Yumura, M.; Iijima, S. *Science* 2004, 306, 1362-1364). For the catalyst preparation, 10 nm of $Al_2O_3$ was deposited using e-beam evaporator onto a Si-substrate with 3.5 μm silicon oxide layer, and additionally 1 nm Fe was deposited as a catalyst. The growth condition was ethylene: $H_2$: Ar=100 sccm: 400 sccm: 600 sccm at 750° C. at 1 atm total pressure for 10 min.

The first few experiments were tried with and without water, but no vertically aligned film was grown in the absence of catalyst pretreatment. Later, the present inventors found that the pretreatment of deposited catalysts tends to be imperative. Oxidation at 500° C. in the air for 10 min., and followed by reduction at 750° C. in 40% of $H_2$ balanced with Ar at 1 atm total pressure for 5 min., or alternatively oxygen plasma treatment for 1-2 min without reduction, was used as a catalyst pretreatment to allow growth of a VA-SWNT film.

The diameter of the tubes varied from 1 nm to 7 nm from the TEM images. The average height of the film was about 30 μm in the absence of water, and the maximum height (80 μm) was achieved with 10 ppm of water as measured by a water sensor (Super-dew, SHAW) which measures dew point of water at the exhaust. To grow a VA-SWNT film, water was not critical, but helpful when right amount of water was involved. The average density of the nanotubes is estimated to be an order of 1% that of closest packing.

Raman data were collected with a Raman microscope (Renishaw Micro-Raman System 1000) using three different excitation lasers (514, 633, 780 nm), the polarization was exactly matched to the direction of bundles to enhance signal. The sharp RBM was observed and the diameter from the RBM data distributes from 0.9 to 1.35 nm, but Raman data that was collected with three lasers can not detect large diameter tubes over 1.5 nm because Raman spectra of SWNT is resonantly enhanced. Also, Rayleigh line and notch filter make it difficult to detect tubes below 100-150 $cm^{-1}$ corresponding to 1.6-2.4 nm. Hence, this diameter measurement from Raman data is not conclusive.

The top surface of VA-SWNT film was covered by a mat of entangled bundles (FIGS. 1 (A) and (B)). This morphology is common to the growth of VA-SWNT films. However, bundles at the bottom of the as-grown film are aligned normal to the optically flat Si wafer substrate; therefore a transfer method which exposes the bottom of the as grown film for application is extremely useful.

Example 2

This example illustrates a system and method involving embedding an entangled mat in an adhesive embedding material.

As shown in FIG. 1 (C), ceramic cement (Omega CC High Temperature cement) was mixed with liquid binder and spread uniformly on a silicon wafer. A VA-SWNT film was contacted to cement mixtures and cured for 24 hours at room temperature or 4 hours at 65° C. After curing, a VA-SWNT film was detached by a mechanical force applied between two substrates. Thus, an optically flat surface of exposed carbon nanotube bundle tips is created which is mechanically strong and resilient against high temperature exposures.

As illustrated in FIGS. 1 (D) and (E), the VA-SWNT film has been flipped over, exposing optically flat surface and very well aligned clean bundles. The whole thickness of the films transferred over due to high tensile strength of nanotubes. Gold particles can be embedded in cement in order to confer conductivity through the transfer base as indicated by an elimination of charging observed under SEM.

Example 3

This example illustrates a system and method involving embedding an entangled mat in a depositable embedding material.

A 70 nm thick gold layer was deposited by a sputter coater or an e-beam evaporator onto both Si wafer coated in a thin Pt layer and VA-SWNT film. The gold-coated VA-SWNT film was pressed against the gold-coated Si wafer and baked in Ar at 800° C. for 5 minutes to fuse the two gold films. High pressure tends to produce a bending of the nanotubes in the carpet which is retained as a wavy morphology. Such bending also creates a shearing force between the nanotube and the substrates in contact. the transfer substrate is thought to have a higher resistance to shear force so that the nanotube is preferentially debonded from the growth substrate. After baking, the Si wafer and growth substrate were pried apart; the flipped-over film was removed from the growth surface and transferred intact to the transfer substrate. Through this means, we were able to flip over the whole surface of the as-grown film (FIG. 2) to conductive surface reproducibly without disrupting the morphology of the as-grown film.

This method creates a better mechanical connection than previous methods, indicated by increased resistance to destruction by sonication. Also, this method mechanically stabilizes the structure of the film. Upon wetting and drying the as grown carpet shows significant morphological change, the flipped-over surface shows only minor effects from this treatment. This type of flip-over treatment has proven robust for a variety of uses. By sputtering a metallic layer onto plastic sheets and other flexible materials transfer of the carpet has been achieved to wide variety of substrates of the film.

It has been observed that extended heat treatment of transferred films can cause the gold to bead and that when it does so it carries the embedded VA-SWNT film with it drawing the VA-SWNT films into denser "islands" instead of a uniform film. It is therefore supposed that this method can be readily adapted to patterning of these transferred carpets by prepatterning a layer of material under the gold with various regions of different wetting characteristics for the molten gold.

Although the invention has been described with reference to specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. For example, unless otherwise specified, steps of a method may be carried out in any suitable order. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. A system for supporting a single-walled carbon nanotube array, comprising:
   an embedding material, wherein the embedding material comprises:
      an adhesive material comprising cement, and
      a metal powder mixed with the adhesive material, wherein the metal powder comprises gold; a single-walled carbon nanotube array
   an entangled single-walled carbon nanotube mat integral with the single-walled carbon nanotube array,
      wherein the entangled single-walled carbon nanotube mat is embedded in the embedding material,
      wherein the adhesive material in the embedding material is adhered to at least some of the single-walled carbon nanotubes in the entangled single-walled carbon nanotube mat, and
      wherein the single-walled carbon nanotube array is arranged of vertically aligned single-walled carbon nanotubes; and
   a supportive substrate, wherein the embedding material is layered over the supportive substrate, and wherein the supportive substrate is conductive.

2. The system according to claim 1, wherein the embedding material extends to sufficient thickness so as to be self-supportive.

3. The system according to claim 1, wherein the embedding material is electrically conductive.

4. The system according to claim 1, wherein the embedding material comprises a metallic material.

5. The system according to claim 1, wherein the embedding material comprises a nonmetallic material.

6. The system according to claim 1, wherein the vertically aligned single-walled carbon nanotubes comprise functionalized single-walled carbon nanotubes.

7. The system according to claim 1, wherein the vertically aligned single-walled carbon nanotubes comprise unfunctionalized single-walled carbon nanotubes.

8. The system according to claim 1, wherein the adhesive material comprises ceramic cement.

9. A method for supporting a single-walled carbon nanotube array, comprising:
   (a) providing an entangled single-walled carbon nanotube mat integral with the single-walled carbon nanotube array, wherein the single-walled carbon nanotube array is arranged of vertically aligned single-walled carbon nanotubes;
   (b) providing an embedding material, wherein the embedding material comprises:
      an adhesive material comprising cement, and
      a metal powder mixed with the adhesive material, wherein the metal powder comprises gold;
   (c) providing a supportive substrate, wherein the embedding material is layered over the supportive substrate, and wherein the supportive substrate is conductive;
   (d) embedding the entangled single-walled carbon nanotube mat in the embedding material,
      wherein the embedding comprises depositing the embedding material on a surface of at least some of the vertically aligned single-walled carbon nanotubes in the entangled single-walled carbon nanotube mat, and
      wherein the adhesive material in the embedding material adheres to at least some of the entangled and vertically aligned single-walled carbon nanotubes in the single-walled carbon nanotube mat; and
   (e) curing the adhesive material in the embedding material, wherein the curing occurs after embedding the entangled single-walled carbon nanotube mat in the embedding material.

10. The method according to claim 9, further comprising: supporting the embedding material on the substrate.

11. The method according to claim 9, further comprising: extending the embedding material so as to be self-supportive.

12. The method according to claim 9, wherein the embedding material is electrically conductive.

13. The method according to claim 9, wherein the embedding material is not electrically conductive.

14. The method according to claim 9, wherein the embedding material is metallic.

15. The method according to claim 9, wherein the embedding material is nonmetallic.

16. The method according to claim 9, wherein the vertically aligned single-walled carbon nanotubes comprise functionalized single-walled carbon nanotubes.

17. The method according to claim 9, wherein the vertically aligned single-walled carbon nanotubes comprise unfunctionalized single-walled carbon nanotubes.

18. The method according to claim 9, wherein the adhesive material comprises ceramic cement.

* * * * *